(12) United States Patent
Briere

(10) Patent No.: US 9,793,259 B2
(45) Date of Patent: Oct. 17, 2017

(54) INTEGRATED SEMICONDUCTOR DEVICE

(75) Inventor: Michael A. Briere, Woonsocket, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 13/472,756

(22) Filed: May 16, 2012

(65) Prior Publication Data

US 2012/0229176 A1    Sep. 13, 2012

Related U.S. Application Data

(62) Division of application No. 12/174,329, filed on Jul. 16, 2008.

(60) Provisional application No. 60/950,261, filed on Jul. 17, 2007, provisional application No. 60/990,142, filed on Nov. 26, 2007.

(51) Int. Cl.
| | | |
|---|---|---|
| H01L 23/52 | (2006.01) | |
| H01L 27/06 | (2006.01) | |
| H01L 29/04 | (2006.01) | |
| H01L 29/417 | (2006.01) | |
| H01L 29/423 | (2006.01) | |
| H01L 29/66 | (2006.01) | |
| H01L 29/778 | (2006.01) | |
| H01L 21/8258 | (2006.01) | |
| H01L 29/20 | (2006.01) | |

(52) U.S. Cl.
CPC ...... *H01L 27/0617* (2013.01); *H01L 21/8258* (2013.01); *H01L 27/0688* (2013.01); *H01L 29/045* (2013.01); *H01L 29/4175* (2013.01); *H01L 29/42316* (2013.01); *H01L 29/66462* (2013.01); *H01L 29/7786* (2013.01); *H01L 29/2003* (2013.01)

(58) Field of Classification Search
USPC ....... 257/20, 195, 201, 29.091, 29.068, 777, 257/194, E23.169, E29.246; 327/109
See application file for complete search history.

(56) References Cited

U.S. PATENT DOCUMENTS

| | | | | |
|---|---|---|---|---|
| 4,087,900 | A * | 5/1978 | Yiannoulos | 438/324 |
| 4,474,624 | A * | 10/1984 | Matthews | 438/232 |
| 4,774,205 | A | 9/1988 | Choi | |
| 4,940,672 | A * | 7/1990 | Zavracky | H01L 21/8252 148/DIG. 26 |
| 4,996,133 | A | 2/1991 | Brighton et al. | |
| 5,084,637 | A * | 1/1992 | Gregor | 326/81 |
| 6,140,675 | A * | 10/2000 | Sugiura et al. | 257/301 |
| 6,255,198 | B1 * | 7/2001 | Linthicum et al. | 438/481 |
| 7,737,429 | B2 | 6/2010 | Kim et al. | |

(Continued)

FOREIGN PATENT DOCUMENTS

| | | | | |
|---|---|---|---|---|
| CN | 1825539 | A * | 8/2006 | |
| KR | 20030049169 | A * | 6/2003 | |

OTHER PUBLICATIONS

English Abstract of KR 20030049169.*
"Complete Guide to Semiconductor Device" Second Edition, by Ng., 2002.

*Primary Examiner* — Hrayr A Sayadian
(74) *Attorney, Agent, or Firm* — Murphy, Bilak & Homiller, PLLC

(57) ABSTRACT

A III-nitride device that includes a silicon body having formed therein an integrated circuit and a III-nitride device formed over a surface of the silicon body.

8 Claims, 3 Drawing Sheets

(56) References Cited

U.S. PATENT DOCUMENTS

| | | | |
|---|---|---|---|
| 2003/0015767 A1* | 1/2003 | Emrick | H01L 21/8258 257/528 |
| 2003/0034547 A1* | 2/2003 | Johnson | H01L 21/8258 257/532 |
| 2003/0132433 A1* | 7/2003 | Piner | C30B 23/02 257/19 |
| 2004/0069289 A1* | 4/2004 | Ito et al. | 123/652 |
| 2005/0056913 A1* | 3/2005 | Farnworth | 257/642 |
| 2005/0184343 A1* | 8/2005 | Thornton | H01L 27/095 257/351 |
| 2006/0001161 A1* | 1/2006 | Graettingeral | H01L 21/28518 257/751 |
| 2006/0043501 A1* | 3/2006 | Saito et al. | 257/401 |
| 2006/0060871 A1* | 3/2006 | Beach | 257/94 |
| 2006/0091408 A1 | 5/2006 | Kim et al. | |
| 2006/0097407 A1* | 5/2006 | Ito | 257/784 |
| 2006/0273347 A1* | 12/2006 | Hikita et al. | 257/192 |
| 2006/0289876 A1 | 12/2006 | Briere | |
| 2007/0176238 A1* | 8/2007 | Seacrist | 257/350 |
| 2008/0308835 A1 | 12/2008 | Pan | |

* cited by examiner

INTEGRATED SEMICONDUCTOR DEVICE

This is a divisional of application Ser. No. 12/174,329 filed Jul. 16,2008.

RELATED APPLICATION

This application is based on and claims priority to U.S. Provisional Application Ser. No. 60/950,261, filed on Jul. 17, 2007, entitled Monolithic Si IC and GaN FET Using Vias, and U.S. Provisional Application Ser. No. 60/990,142, filed on Nov. 26, 2007, entitled III-Nitride Wafer and Devices Formed in a III-Nitride Wafer, to which claims of priority are hereby made and the disclosures of which are incorporated by reference.

DEFINITION

III-nitride as used herein refers to a semiconductor alloy from the InAlGaN system that includes nitrogen and at least one element from Group III such as, but not limited to, GaN, AlGaN, InN, AlN, InGaN, InAlGaN and the like.

BACKGROUND AND SUMMARY OF THE INVENTION

The present invention relates to III-nitride device technology.

III-nitride, because of its high bandgap, is suitable for high voltage power applications. According to a known design, a III-nitride power device may be fabricated by forming a III-nitride heterojunction over a silicon substrate.

It is also known that integrated circuits for driving power devices such as III-nitride power devices can be formed in silicon using, for example, CMOS technology.

Given the desire to lower power consumption and/or increase switching speed by reducing interconnection inductance and resistance, it is desirable to position, for example, an integrated driver circuit (IC) close to a power device.

In a device according to present invention an IC is formed in a silicon body a surface of which also serves as a substrate for a III-nitride device, such as a III-nitride power device. The IC and the power device can be then operatively coupled, whereby an integrated device may be obtained.

Other features and advantages of the present invention will become apparent from the following description of the invention which refers to the accompanying drawings.

DETAILED DESCRIPTION OF THE FIGURES

An integrated device according to the present invention includes a silicon body in which one or more IC logic devices are formed and a III-nitride power semiconductor device formed over a surface of the silicon substrate and preferably operatively coupled to at least one of the IC logic devices.

Figure 1:
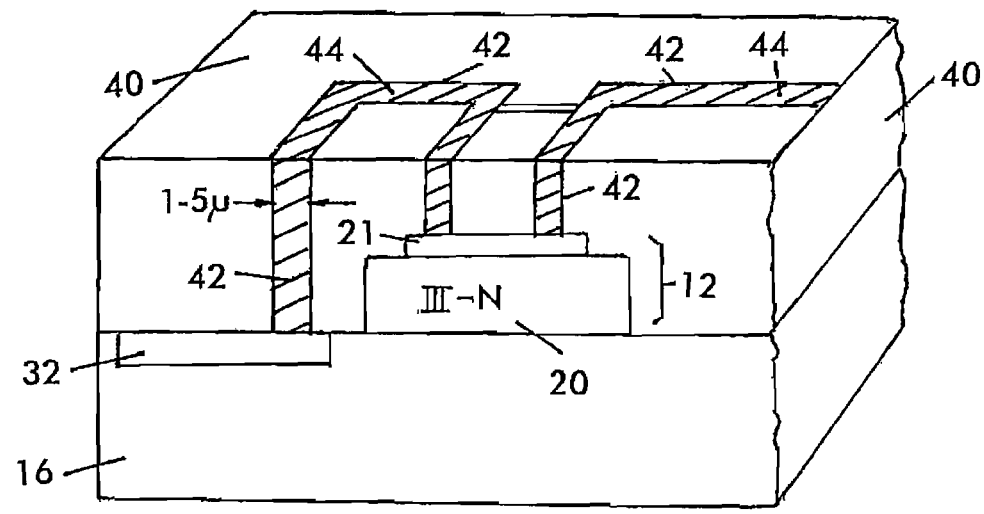
FIG. 1 illustrates a cross-sectional view of a first embodiment of the present invention.

Referring to FIG. 1, an integrated semiconductor device according to a first embodiment of the present invention includes an IC semiconductor logic device 32 formed in a silicon body 16, and a III-nitride power semiconductor device 12 formed over a major surface of silicon body 16. Note that IC device 32 is preferably positioned laterally to the III-nitride power device 12. In the preferred embodiment, III-nitride semiconductor device 12 may be a heterojunction power device having a schottky or an insulated gate such as a HEMT (high electron mobility transistor) examples of which are disclosed in U.S. Patent Application Publication No. 2006/0060871 and U.S. Pat. No. 5,192,987 or a III-nitride FET. IC semiconductor logic device 32 may be a silicon based driver or the like integrated circuit for driving III-nitride device 12.

According to an aspect of the present invention, an insulation body 40 (e.g., an oxide body such as $SiO_2$) is formed over IC semiconductor logic device 32 as well as III-nitride device 12. One or more vias 42 are opened in insulation body 40, each via 42 including a conductive (e.g. metal) filler 44 leading from an electrode of IC semiconductor logic device 32 to at least one electrode of III-nitride device 12. Thus, for example, a via 42 may lead from the gate electrode of III-nitride device 12 to an electrode of IC device 32 that supplies drive signals to the gate electrode.

To fabricate a device according to the present invention, first a semiconductor body 16 is prepared to serve as a substrate for III-nitride device 12. Thereafter, a III-nitride body 20 (e.g. AlN) is formed over silicon body 16 using any desired technique. III-nitride body 20 may serve as a buffer layer or a transition layer.

Next, IC semiconductor logic device 32 is formed in silicon body 16 on a different plane lateral to III-nitride body 20, and then the rest of III-nitride device 12 is formed on III-nitride body 20 on silicon body 16. Thus, for example, a III-nitride heterojunction device such as a high electron mobility transistor may be formed by growing an active body 21 that includes an active III-nitride heterojunction over buffer layer 20. Alternatively, a III-nitride FET may be formed over III-nitride body 20.

Thereafter, insulation body 40 is formed and then planarized using, for example, CMP. Vias 42 are next opened in body 40 using any desired method and filled with conductors 44 to connect IC 32 and III-nitride device 12 to complete a device according to the present invention. Vias 42 may be 1-5 μm wide.

Note that the present invention is not limited to one III-nitride body 20, but multiple III-nitride bodies 20 each for at least one III-nitride device 12 can be provided without departing from the scope and spirit of the present invention.

Figure 2:
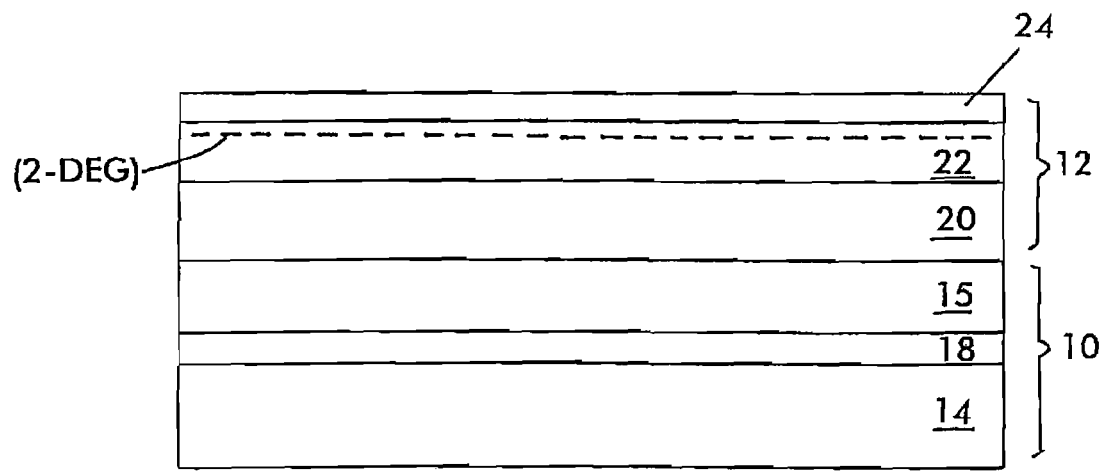
FIG. 2 illustrates a cross-sectional view of a semiconductor wafer for the fabrication of a device according to other embodiments of the present invention.

Referring to FIG. 2, a semiconductor wafer used for fabrication of a device according to the second embodiment of the present invention includes a support substrate 10 and a III-nitride semiconductor body 12 formed over support substrate 10.

According to an aspect of the present invention, support substrate 10 includes a first silicon body 14, a second silicon body 15 and an insulation body 18 interposed between first silicon body 14 and second silicon body 18. In one embodiment, first silicon body 14 may be a <111> single crystal silicon, second silicon body may be <111> single crystal silicon, and insulation body 18 may be silicon dioxide. In another embodiment, first silicon body 14 may be <100> silicon, second silicon body 15 may be <111> silicon, and insulation body 18 may be silicon dioxide.

In both embodiments, an SOI (silicon on insulator) substrate is suitable. Such substrates include two silicon substrates bonded to one another by a silicon dioxide layer. The first embodiment can also be realized by a SiMox process whereby implantation of oxygen into a <111> silicon substrate followed by an annealing step forms an insulation body 18 made of silicon dioxide between a first <111> silicon body 14 and a second <111> silicon body 15. Note that second silicon) body 15 may optionally include an epitaxially grown layer thereon. Furthermore, note that other than SiMox, or silicon bonded to silicon, other methods can be used to realize a device according to the present invention.

III-nitride semiconductor device 12 includes, in one preferred embodiment, a III-nitride buffer layer 20 (e.g. AlN), over second silicon body 15, and a III-nitride heterojunction formed over III-nitride buffer layer 20, that includes a first III-nitride layer 22 having one band gap (e.g. GaN) and a second III-nitride layer 24 having another band gap (e.g. AlGaN, InAlGaN, InGaN, etc.) formed over first layer 22. The composition and/or the thickness of first and second III-nitride layers 22 and 24 are selected to result in the formation of a carrier rich region referred to as a two-dimensional electron gas (2-DEG) near the heterojunction thereof.

According to one aspect of the present invention, the III-nitride heterojunction can be used as the current carrying region of a III-nitride power semiconductor device (e.g. a high electron mobility transistor).

Figure 3:
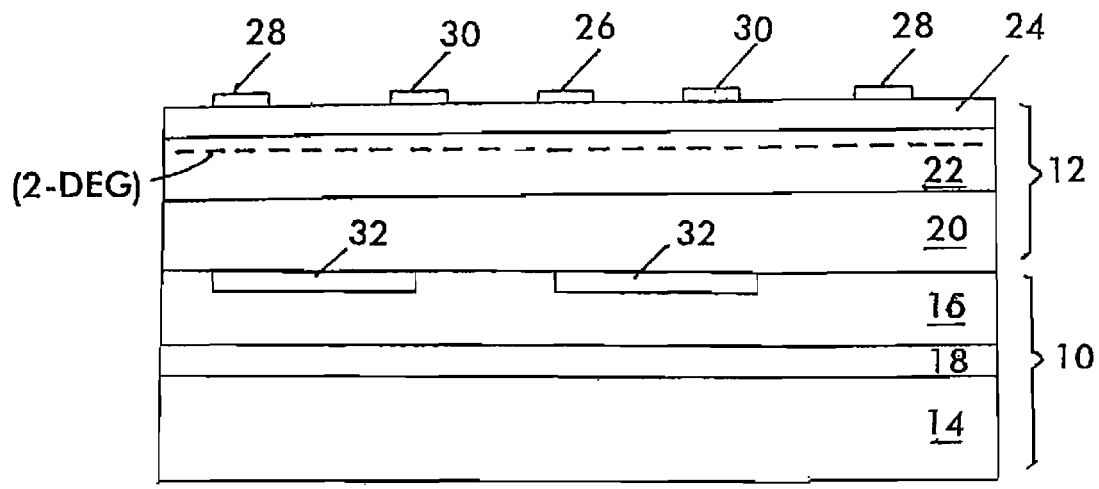
FIG. 3 illustrates a cross-sectional view of another III-nitride device according to the second embodiment of the present invention.

Referring to FIG. 3, a III-nitride high electron mobility transistor may include first and second power electrodes 26, 28 (e.g. source and drain electrodes) coupled to the 2-DEG through second III-nitride layer 24 and gate arrangements 30 each disposed between a respective first power electrode 26 and second power electrode 28. A gate arrangement may include an insulated gate electrode or a gate electrode that makes Schottky contact to second III-nitride layer 24.

In a device according to the first embodiment, active body 21 residing on buffer layer 20 may include a III-nitride heterojunction formed over III-nitride buffer layer 20, that includes a first III-nitride layer 22 having one band gap (e.g. GaN) and a second III-nitride layer 24 having another band gap (e.g. AlGaN, InAlGaN, InGaN, etc.) formed over first layer 22. The composition and/or the thickness of first and second III-nitride layers 22 and 24 are selected to result in the formation of a carrier rich region referred to as a two-dimensional electron gas (2-DEG) near the heterojunction thereof. Furthermore, body 21 may include first and second power electrodes 26, 28 (e.g. source and drain electrodes) coupled to the 2-DEG through second III-nitride layer 24 and gate arrangements 30 each disposed between a respective first power electrode 26 and second power electrode 28. A gate arrangement may include an insulated gate electrode or a gate electrode that makes Schottky contact to second III-nitride layer 24. Thus, a III-nitride device 12 in the first embodiment may include features similar to those in the second embodiment.

In a device according to the second embodiment, semiconductor devices 32 may be formed in second silicon body 15. In one preferred embodiment, semiconductor devices 32 may be logic devices formed using CMOS technology for the purpose of operating the III-nitride device 12. For example, semiconductor devices 32 may be part of a driver circuit for driving III-nitride device 12. Note that in the second embodiment semiconductor devices 32 are disposed directly below III-nitride power device 12.

Figure 4:
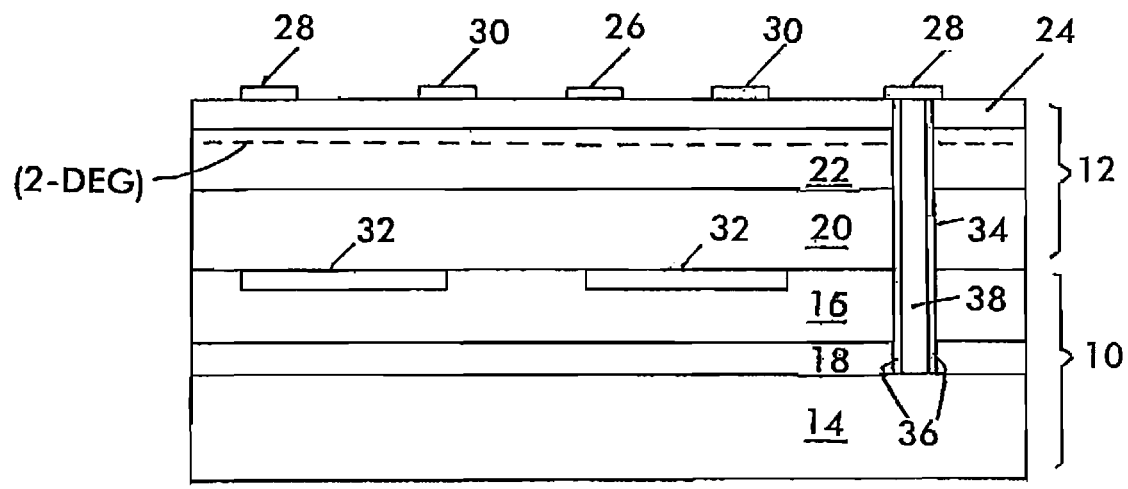
FIG. 4 illustrates a cross-sectional view of a third embodiment of a device according to the present invention.

Referring now to FIG. 4, according to the third embodiment, a via 34 that extends from the top of second III-nitride layer 24 to, for example, first silicon body 14 may be provided to allow for electrical communication between one of the power electrodes 28 (e.g. source or drain) and first silicon body 14. Via 34 may include an insulation body 36 on the walls thereof, and an electrically conductive body 38 (e.g. a metallic body or conductive semiconductor body such as polysilicon) connecting electrode 28 to first silicon body 14.

Figure 5:
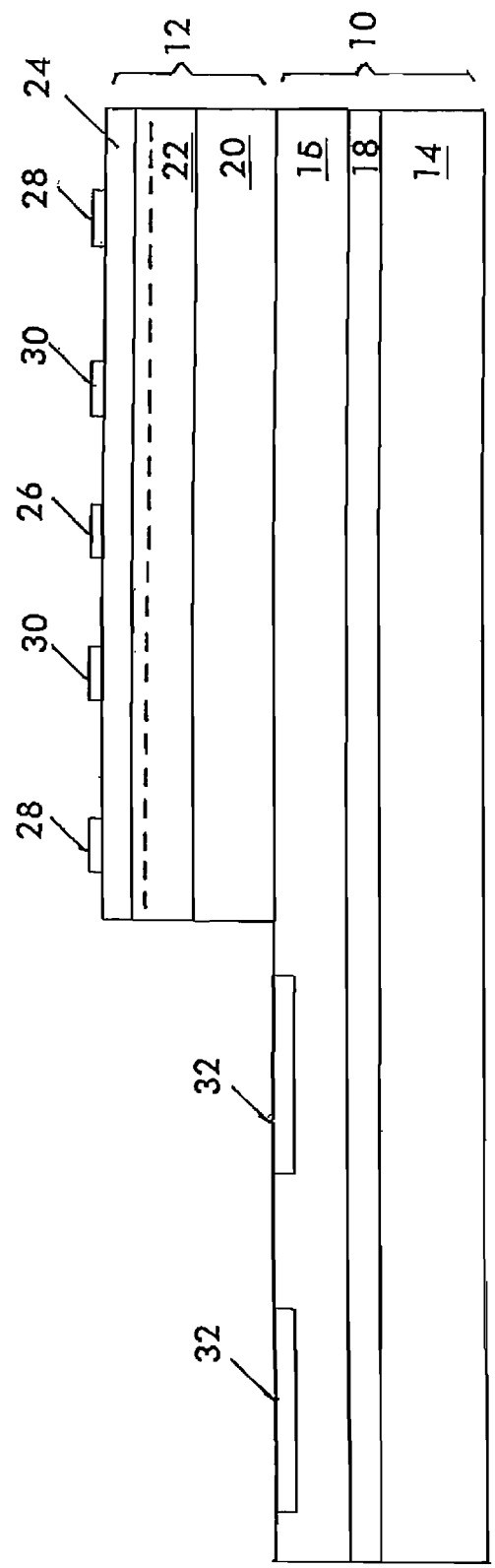
FIG. 5 illustrates a cross-sectional view of a fourth embodiment of a device according to the present invention.

Referring now to FIG. 5, in which like numerals identify like feature, in a device according to the fourth embodiment of the present invention, a portion of the III-nitride body 12 is removed to expose an area of second silicon body 15. Semiconductor devices 32 are formed in the exposed area of second silicon body 15 lateral to the III-nitride power device 12, rather than being disposed directly below the III-nitride power semiconductor device 12.

A wafer used in a device according to the present invention can be used to devise power devices for high voltage applications because of the presence of insulation body 18, which reduces leakage current into the substrate and improves the breakdown voltage of the device. For example, when insulation body 18 is silicon dioxide, its thickness can be 0.1 to 2 microns to increase the breakdown voltage of the device. In one embodiment, for instance, silicon body 18 may be about 0.5 microns thick for a 700-1000 volt III-nitride power device.

Note further that silicon body 14 and/or silicon body 15 may be doped with N-type dopants or P-type dopants. Thus, silicon bodies 14, 16 may be N++ doped or P++ doped. N++ doped or P++ doped first silicon body can improve the breakdown capability of the device by taking advantage of the resurf effect.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An integrated semiconductor device comprising:
    a silicon on insulator (SOI) substrate comprising a first silicon body, an insulation body formed on said first silicon body, and a second silicon body formed on said insulation body;
    a III-nitride heterostructure formed over a top surface of said SOI substrate, said heterostructure comprising a III-nitride buffer layer formed over said SOI substrate, a first III-nitride layer formed over said buffer layer, and a second III-nitride layer formed over said first III-nitride layer;
    a power transistor formed in said heterostructure;
    a driver circuit configured to drive said power transistor, said driver circuit comprising a silicon device formed in said second silicon body below said top surface; and
    a via extending through said heterostructure, through said second silicon body, and through said insulation body to make electrical contact between an electrode of said power transistor and said first silicon body, said via having walls lined by an insulation body and comprising conductive filler;
    wherein said power transistor includes a two-dimensional electron gas (2-DEG).

2. The integrated semiconductor device of claim 1, wherein said silicon device is an integrated circuit.

3. The integrated semiconductor device of claim 1, wherein said driver circuit comprises another silicon device formed in said second silicon body.

4. The integrated semiconductor device of claim 1, wherein said silicon device is positioned lateral to said transistor.

5. An integrated semiconductor device comprising:
- a silicon on insulator (SOI) substrate comprising a first silicon body, an insulation body formed on said first silicon body, and a second silicon body formed on said insulation body;
- a III-nitride heterostructure formed over a top surface of said SOI substrate, said heterostructure comprising a III-nitride buffer layer formed over said SOI substrate, a first III-nitride layer formed over said buffer layer, and a second III-nitride layer formed over said first III-nitride layer;
- a III-nitride power transistor formed in said heterostructure;
- a logic device formed in said second silicon body below said top surface, said logic device operatively coupled to a gate electrode of said III-nitride power transistor;
- a via extending through said heterostructure, through said second silicon body, and through said insulation body to make electrical contact between an electrode of said III-nitride power transistor and said first silicon body, said via having walls lined by an insulation body and comprising conductive filler;
- wherein said III-nitride power transistor includes a two-dimensional electron gas (2-DEG).

6. The integrated semiconductor device of claim 5, wherein said III-nitride power transistor is a high electron mobility transistor.

7. The integrated semiconductor device of claim 5, wherein said logic device is an integrated circuit logic device.

8. The integrated semiconductor device of claim 5, wherein said logic device is configured to supply drive signals to said gate electrode of said III-nitride power transistor.

* * * * *